(12) United States Patent
Fotakis et al.

(10) Patent No.: US 7,376,921 B2
(45) Date of Patent: May 20, 2008

(54) METHODS FOR TILING INTEGRATED CIRCUIT DESIGNS

(75) Inventors: Dimitris K. Fotakis, Saratoga, CA (US); Milan F. Jukl, San Jose, CA (US)

(73) Assignee: Athena Design Systems, Inc., Santa Clara, CA (US)

( * ) Notice: Subject to any disclaimer, the term of this patent is extended or adjusted under 35 U.S.C. 154(b) by 174 days.

(21) Appl. No.: 11/357,823

(22) Filed: Feb. 17, 2006

(65) Prior Publication Data

US 2007/0198960 A1   Aug. 23, 2007

(51) Int. Cl.
*G06F 17/50* (2006.01)

(52) U.S. Cl. .............. 716/7; 716/13; 716/14

(58) Field of Classification Search ........... 716/7, 716/13, 14
See application file for complete search history.

(56) References Cited

U.S. PATENT DOCUMENTS

| | | | |
|---|---|---|---|
| 3,617,714 A | 11/1971 | Kernighan | |
| 4,577,276 A | 3/1986 | Dunlop et al. | |
| 4,918,614 A * | 4/1990 | Modarres et al. | 716/10 |
| 5,157,618 A | 10/1992 | Ravindra et al. | |
| 5,224,056 A * | 6/1993 | Chene et al. | 716/7 |
| 5,487,018 A | 1/1996 | Loos et al. | |
| 5,495,419 A * | 2/1996 | Rostoker et al. | 700/121 |
| 5,513,124 A * | 4/1996 | Trimberger et al. | 716/7 |
| 5,519,629 A | 5/1996 | Snider | |
| 5,587,923 A * | 12/1996 | Wang | 716/13 |
| 5,822,214 A | 10/1998 | Rostoker et al. | |
| 5,943,486 A * | 8/1999 | Fukui et al. | 716/9 |
| 6,000,038 A | 12/1999 | Scepanovic et al. | |
| 6,182,272 B1 * | 1/2001 | Andreev et al. | 716/13 |
| 6,223,328 B1 * | 4/2001 | Ito et al. | 716/6 |
| 6,240,542 B1 * | 5/2001 | Kapur | 716/12 |
| 6,269,469 B1 * | 7/2001 | Pavisic et al. | 716/12 |
| 6,289,495 B1 | 9/2001 | Raspopovic et al. | |
| 6,305,000 B1 * | 10/2001 | Phan et al. | 716/5 |
| 6,324,674 B2 * | 11/2001 | Andreev et al. | 716/12 |
| 6,327,693 B1 | 12/2001 | Cheng et al. | |
| 6,349,403 B1 * | 2/2002 | Dutta et al. | 716/12 |
| 6,480,991 B1 * | 11/2002 | Cho et al. | 716/8 |
| 6,519,749 B1 | 2/2003 | Chao et al. | |
| 6,574,782 B1 * | 6/2003 | Dewey et al. | 716/5 |
| 6,618,846 B2 * | 9/2003 | Cheng | 716/5 |
| 6,865,726 B1 * | 3/2005 | Igusa et al. | 716/18 |
| 6,889,372 B1 | 5/2005 | Teig et al. | |
| 7,107,561 B2 * | 9/2006 | Ali et al. | 716/10 |
| 7,185,305 B1 * | 2/2007 | Rodman | 716/13 |
| 7,284,223 B2 * | 10/2007 | Katagiri | 716/12 |
| 7,299,442 B2 * | 11/2007 | Alpert et al. | 716/12 |
| 2001/0018759 A1 * | 8/2001 | Andreev et al. | 716/7 |
| 2002/0087940 A1 * | 7/2002 | Greidinger et al. | 716/2 |
| 2003/0005398 A1 * | 1/2003 | Cho et al. | 716/8 |
| 2003/0084416 A1 * | 5/2003 | Dai et al. | 716/7 |
| 2003/0106036 A1 * | 6/2003 | Aoki | 716/13 |

(Continued)

*Primary Examiner*—Phallaka Kik
(74) *Attorney, Agent, or Firm*—Blakely, Sokoloff, Taylor & Zafman LLP

(57) ABSTRACT

Methods for routing in the design of integrated circuits (ICs) to simplify the routing task. The method includes dividing a given IC design into a limited number of non-overlapping tiles, and then routing all tiles in parallel, each tile being independently routed by a standard router. Thereafter, routed tiles are assembled to form a routing solution for the entire IC. Details of exemplary methods are disclosed.

24 Claims, 9 Drawing Sheets

U.S. PATENT DOCUMENTS

| | | | |
|---|---|---|---|
| 2003/0121017 A1* | 6/2003 | Andreev et al. | 716/12 |
| 2003/0121020 A1* | 6/2003 | Kaptanoglu | 716/16 |
| 2004/0225983 A1* | 11/2004 | Jacques et al. | 716/9 |
| 2005/0172252 A1* | 8/2005 | Cheng et al. | 716/10 |
| 2005/0193354 A1* | 9/2005 | Ohba et al. | 716/5 |
| 2005/0240893 A1* | 10/2005 | Teig et al. | 716/13 |
| 2005/0251775 A1* | 11/2005 | Wood | 716/10 |
| 2005/0273746 A1* | 12/2005 | Malhotra et al. | 716/13 |
| 2005/0273748 A1* | 12/2005 | Hetzel et al. | 716/14 |
| 2006/0036984 A1* | 2/2006 | Mukaihira | 716/5 |
| 2006/0248492 A1* | 11/2006 | Hetzel | 716/14 |
| 2007/0033562 A1* | 2/2007 | Correale et al. | 716/10 |
| 2007/0094630 A1* | 4/2007 | Bhooshan | 716/13 |
| 2007/0150846 A1* | 6/2007 | Furnish et al. | 716/8 |

* cited by examiner

METHODS FOR TILING INTEGRATED CIRCUIT DESIGNS

BACKGROUND OF THE INVENTION

1. Field of the Invention

The present invention relates generally to the design of integrated circuits (ICs), and more particularly to the routing phase of an IC design.

2. Prior Art

Due to the ever increasing complexity of integrated circuit (IC) designs, IC designers become more and more reliant on electronic design automation (EDA) tools. An IC is fabricated by a series of lithographic steps that may be abstracted as a construction of a multilayered stack of materials, each layer consisting of a large set of simple geometries. In the related art, EDA tools that manipulate modular sets (e.g., component libraries, IP blocks, and so on) of simple geometries are provided. Each such modular set consists of geometries that exist on several or all lithographic layers of the IC and contains a logic function, ranging from a simple inverter library cell to an IP block module that may hold a microprocessor.

Generally, the processing steps taken by an EDA tool to obtain an IC layout are: a) mapping of the logic for an IC to existing blocks and further partitioning the circuit into blocks of modules or circuits; b) floor planning, which finds the alignment and relative orientation of the circuit blocks; c) placement, which determines more precisely the positions of the circuit blocks and their component blocks; d) routing, which completes the interconnects among electrical components; and e) verification, which checks the layout to ensure that it meets design and functional requirements.

Routing is a key operation in the physical design cycle. Routing consists of establishing a set of electrical conductors that may be constructed on almost any of the geometries and most of the lithographic layers. However, due to the ever-increasing electrical constraints, modern ICs bound all routing geometries to metal layers, wherever such layers have not been utilized by the connections within the library modules or IP building blocks. Given the fact that modern technology includes many metal layers, placement procedures construct a complete packing of the building IP modules or blocks with no space reserved for routing. All routing is then constructed from geometries that exist on the layers above the building blocks contents.

A set of terminal points to be connected is commonly known as a net. Geometries that may have been utilized in the construction of the already placed building blocks are represented as a list of obstacles for the routing problem. Routing is usually performed in two phases: global and detailed. In the global routing, the routing of the nets of the circuit disregards the exact geometric details of each wire and terminal. For each wire, a global router finds a topology that represents the wires of a given net. That is, the global routing specifies the loose route of a wire through the routing space, attempting to reconcile net demand on routing space. The global routing is followed by a detailed routing that completes the point-to-point connections, thereby realizing the connectivity of each net. Global routing usually includes detailed information, such as layer assignment of wire segments, widths of wires, and so on. The detailed routing is performed using a fine router.

Due to the fact that a typical IC consists of millions of nets, a routing of a single net is a NP-hard problem. This fact indicates a potential of extremely high demands on computational resources. Therefore, it would be advantageous to provide a solution that simplifies the routing of IC designs and allows routing tasks to be executed by standard computational resources.

DETAILED DESCRIPTION OF THE PREFERRED EMBODIMENTS

The present invention comprises a method that allows the simplification of the routing phase in the design of integrated circuits (ICs). Using the disclosed method, the time expended on the routing task is significantly reduced. The method includes dividing a given IC design into a limited number of non-overlapping tiles, and then routing all tiles in parallel, each tile being independently routed by a standard router. Thereafter, routed tiles are assembled to form a routing solution for the entire IC.

Figure 1:
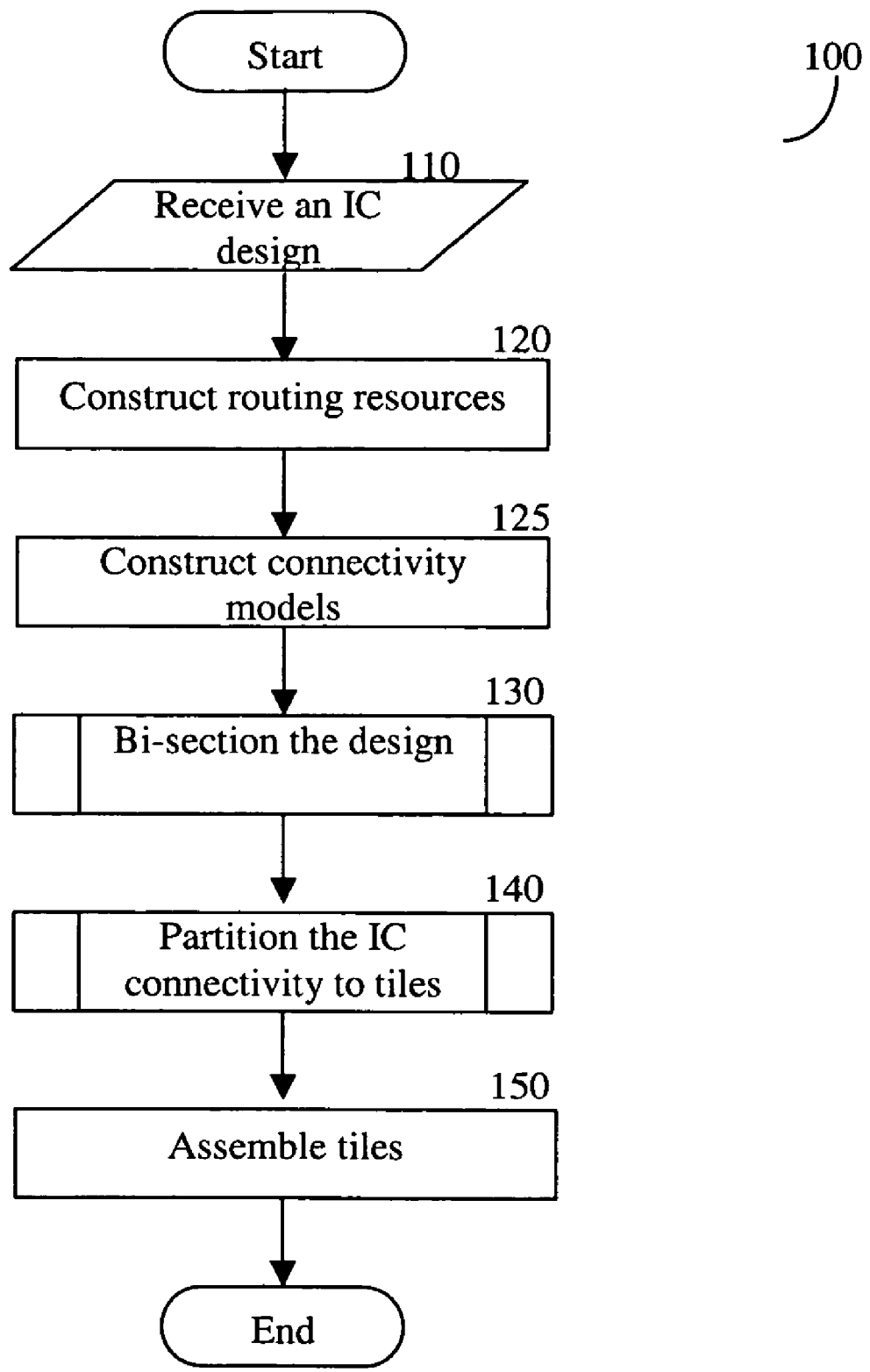
FIG. 1 is a flowchart describing a method for tiling an IC design in accordance with one embodiment of the present invention.

FIG. 1 shows an exemplary and non-limiting flowchart 100 describing a method for tiling an IC design in accordance with one embodiment of the present invention. At 110, the files of an IC design to be tiled are received. The input design may be a result of a placement or routing tool. Input from a global router can be utilized to tile the design and then routing the tiles using fine routers. Input from a fine router can be utilized for tiling the design for the purpose of optimization, calculating delays, and RC extraction.

Figure 2A:
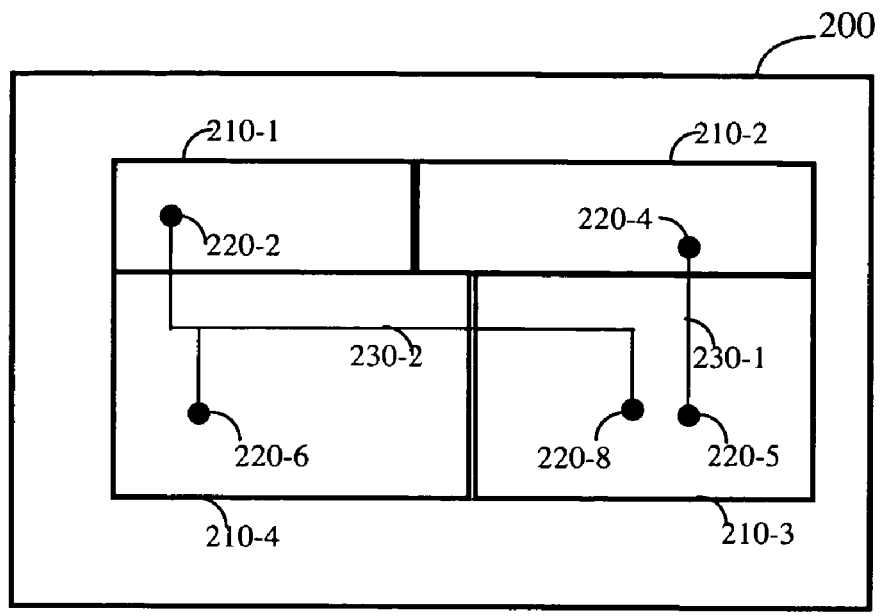
FIGS. 2A, 2B, 2C and 2D are schematic diagrams of an IC design used to exemplify the techniques of the tiling method of FIG. 1.

FIG. 2A shows an exemplary IC design 200 used to describe the techniques of the disclosed method. IC 200 includes four cells 210-1 through 210-4. Each cell 210 may represent a single logic element, such as a gate, or several logic elements interconnected in a standardized manner to perform a specific function. Each of cells 210 has at least one port (or a terminal points) 220, each of which may be connected, by wires, to one or more other ports 220 of IC 200. The wires connecting the ports of the IC are also formed on the surface of the IC. IC 200 includes two nets 230-1 and 230-2. Net 230-1 is a two-port net comprising ports 220-4 and 220-5 and net 230-2 is a three-port net consisting of ports 220-2, 220-6, and 220-8. A cell may further include one or more input and output ports (not shown in FIG. 2A).

Figure 2B:
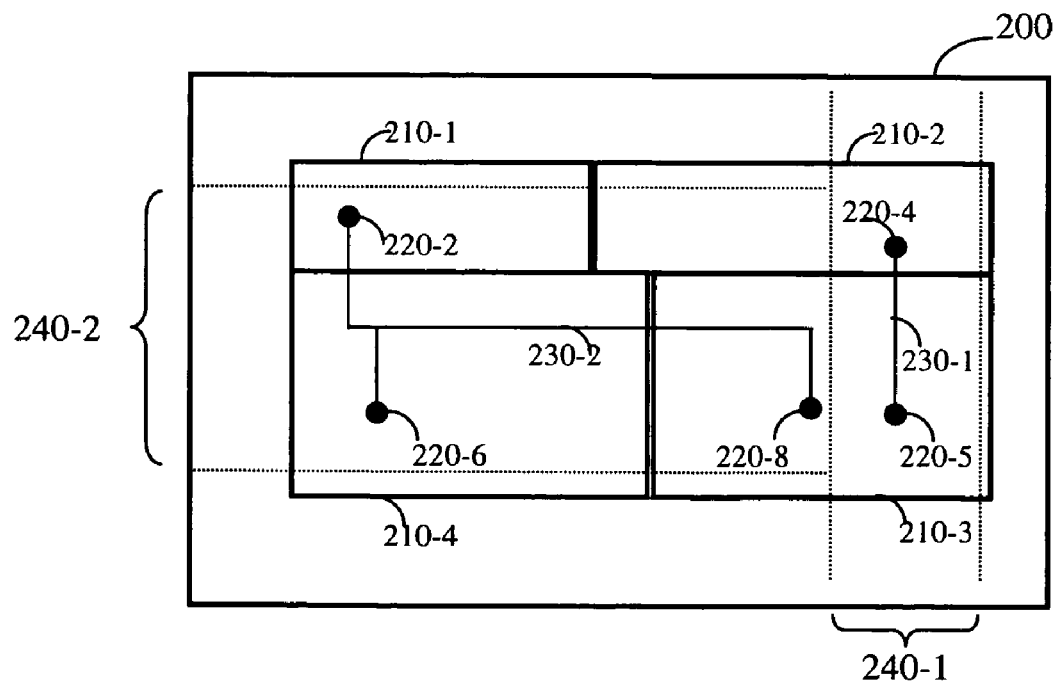

At 120, a routing capacity of each metal lithographic layer is determined. Specifically, layers are sorted into vertical and horizontal metal tracks. Then the capacity of the horizontal and vertical metal tracks is computed. This is performed by examining each layer's properties from data provided by an IC manufacturer (foundry). At 125, the method constructs a model of the connectivity for each net with respect to its horizontal and vertical routing resource demands. This is done by constructing a set of horizontal and vertical wire segments to be realized on the IC area. The construction is based on the input IC provided in 110 and the routing resources determined at 120. Specifically, if the input IC is provided by a global routing tool, the horizontal and vertical segments are the resultant wiring of this tool. If the nets of the IC were fine routed, the segments generated by the fine router are utilized. If the input IC provided by a placement tool, i.e., no routing (global or fine) data is available, for each net an enclosing rectangle including all ports of a net is constructed. The two opposite (parallel) sides of such a rectangle is the wire segment. FIG. 2B shows the IC 200 where a vertical wire segment 240-1 and a horizontal wire segment 240-2 are constructed. The vertical and horizontal segments 240-1 and 240-2 include nets 230-1 and 230-2, respectively.

Figure 2C:
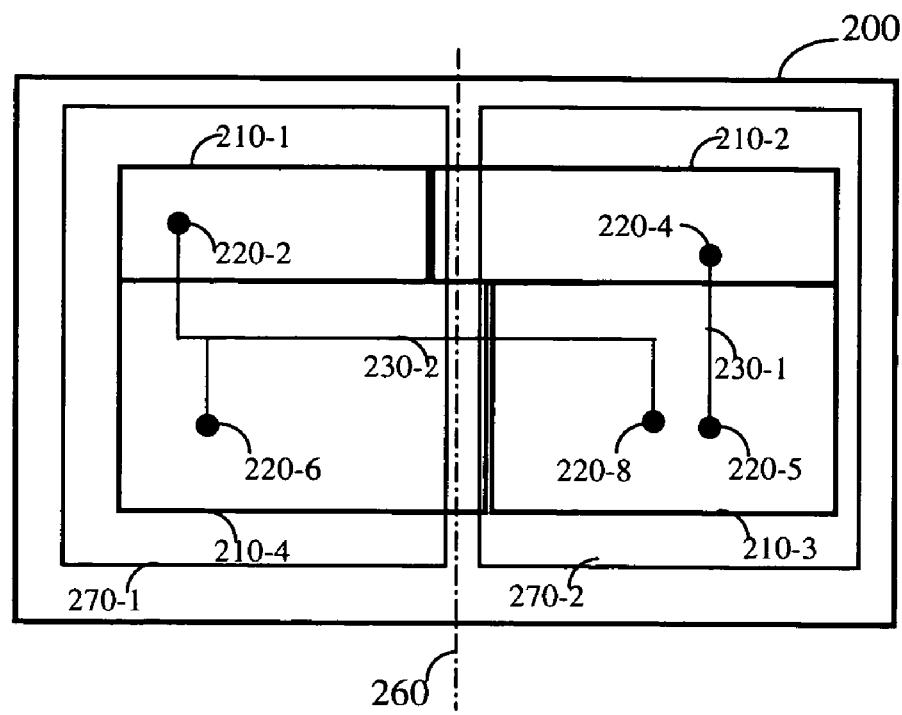
Figure 3:
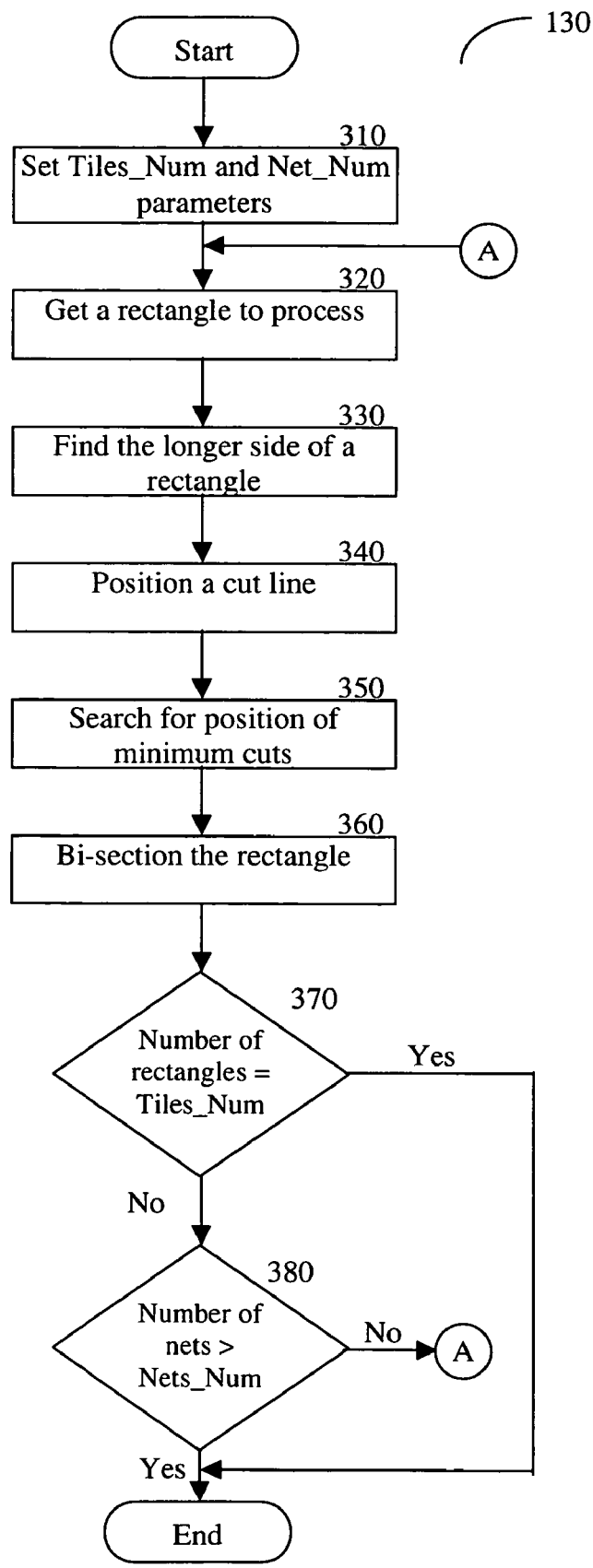
FIG. 3 is a flowchart describing the execution of the bisection task in accordance with one embodiment of the present invention.

At 130, potential tiles in the input IC design are determined by bi-sectioning the input design. FIG. 3 shows the execution of the bisection process in greater detail. At 310, a first parameter (Tiles_Num) and a second parameter (Nets_Num) are set to their initial values. At 320, a rectangle to be divided is received as an input. A rectangle is a part or the entire IC design and includes its respective horizontal and vertical wire segments. At 330, the longer side of the rectangle is found, and then, at 340, a cut line is perpendicularly positioned to that side. This is performed in order to generate a rectangle tile with an aspect ratio close to one. The cut line is also perpendicular to a direction of given horizontal or vertical sets of segments. At 350, the process looks for a cut line position where the cut line will cut a minimum number of wire segments running in the orthogonal direction. In order to achieve tiles with a reasonable size, the position of the cut line should be within a predefined range (e.g., between 30% and 70%) of the perpendicular dimension of the rectangle being cut. At 360, in the position determined at 350, the original rectangle is divided into two rectangles. FIG. 2C shows IC 200 that includes a cut line 260 that is perpendicular to horizontal segment 240-2. As can be shown, cut line 260 crosses segment 240-2 in one location, i.e., only one net is divided. As a result, cut line 260 is the partition of IC 200 and forms two rectangles 270-1 and 270-2. At 370, a check is made to determine if the number of rectangles equals to the value of the Tiles_Num parameter, and if so execution terminates; otherwise, execution continues with 380. At 380, another check is performed to determine if the number of nets in each rectangle is below the value of the Nets_Num parameter, and if so execution ends; otherwise, execution returns to 320 where the execution is repeated with the rectangles constructed at 360.

Figure 2D:
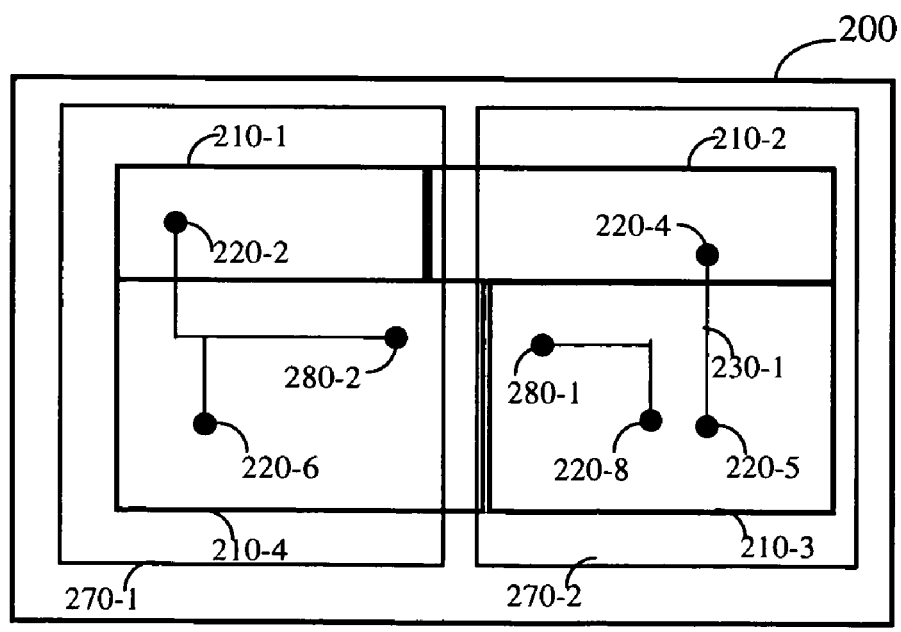
Figure 4:
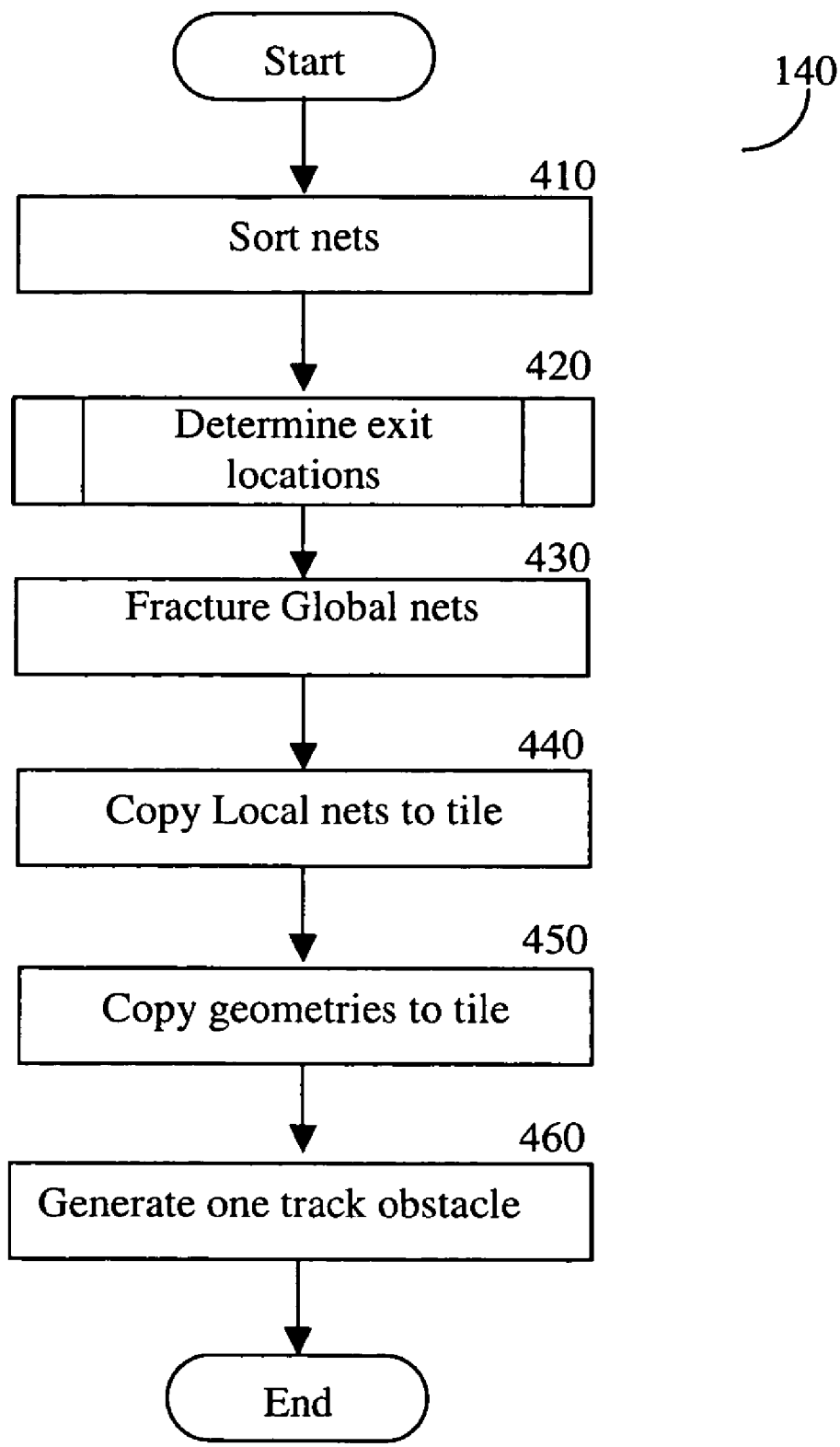
FIG. 4 is a flowchart describing the process for partitioning the IC connectivity.

At 140, the IC connectivity is partitioned, based on the constructed rectangles, and thereby forming an overlay of the IC area. FIG. 4 shows the execution of the partitioning task in greater detail. At 410, all nets in the input IC design are sorted into two groups: Local and Global. A Local net is entirely bounded in a single tile, whereas Global nets reside in two or more tiles. At 420, exact positions of exit locations of each Global net on the boundaries of each tile are identified. This is performed to allow the separation of a routing task of the entire IC into multiple independent tasks. The execution of the process performed at 420 is described in greater detail below with reference to FIG. 5. At 430, Global nets are fragmented into fragments, where exit locations and terminal points of a given net inside a tile form a new net (hereinafter "tile net"). At 440, terminals of Local nets are copied as a single tile net into a tile that the Local nets belong to. At 450, for each tile, obstacle and fixed geometries that are in the area of the tile are copied to the tile. That is, a tile includes all information of the piece of an IC that it covers. At 460, for each tile, one track obstacle of a guard band is generated. This is performed to communicate existence of features inside adjacent tiles that may be near the boundaries of the tile. The result of the partitioning process is a set of tiles that together form an overlay of the IC area. In a typical IC, but not by way of limitation, the desired number of such tiles is between 1 and 100. FIG. 2D depicts IC 200 after the partitioning the connectivity. As shown, two tiles 270-1 and 270-2 are constructed were the tiles boundaries are on top of cells 210. The net 230-2 has connection points in both tiles 270, and thus this net is divided to form the adjacent abutting exit locations 280-1 and 280-2.

It should be noted that all data on tile boundaries is defined as fixed and any changes made to this data requires the reconstruction of the respective tile and its neighbor tiles. The reconstruction of tiles can be carried out by repeating the execution of the partitioning task discussed with reference to FIG. 4.

Upon completion of the tiling of the input IC design, each tile is sent to a router. This allows the routing of up to all, or at least two tiles, on a set of distributed routers simultaneously. At 150, once the routing of each tile is completed, its resulting wires are assembled (i.e., copied and merged) together to form a routing solution for the entire IC. It should be appreciated by a person skilled in the art that by routing the tiles independently and simultaneously, the time required for completing the routing phase is reduced typically by an order of magnitude.

Figure 5:
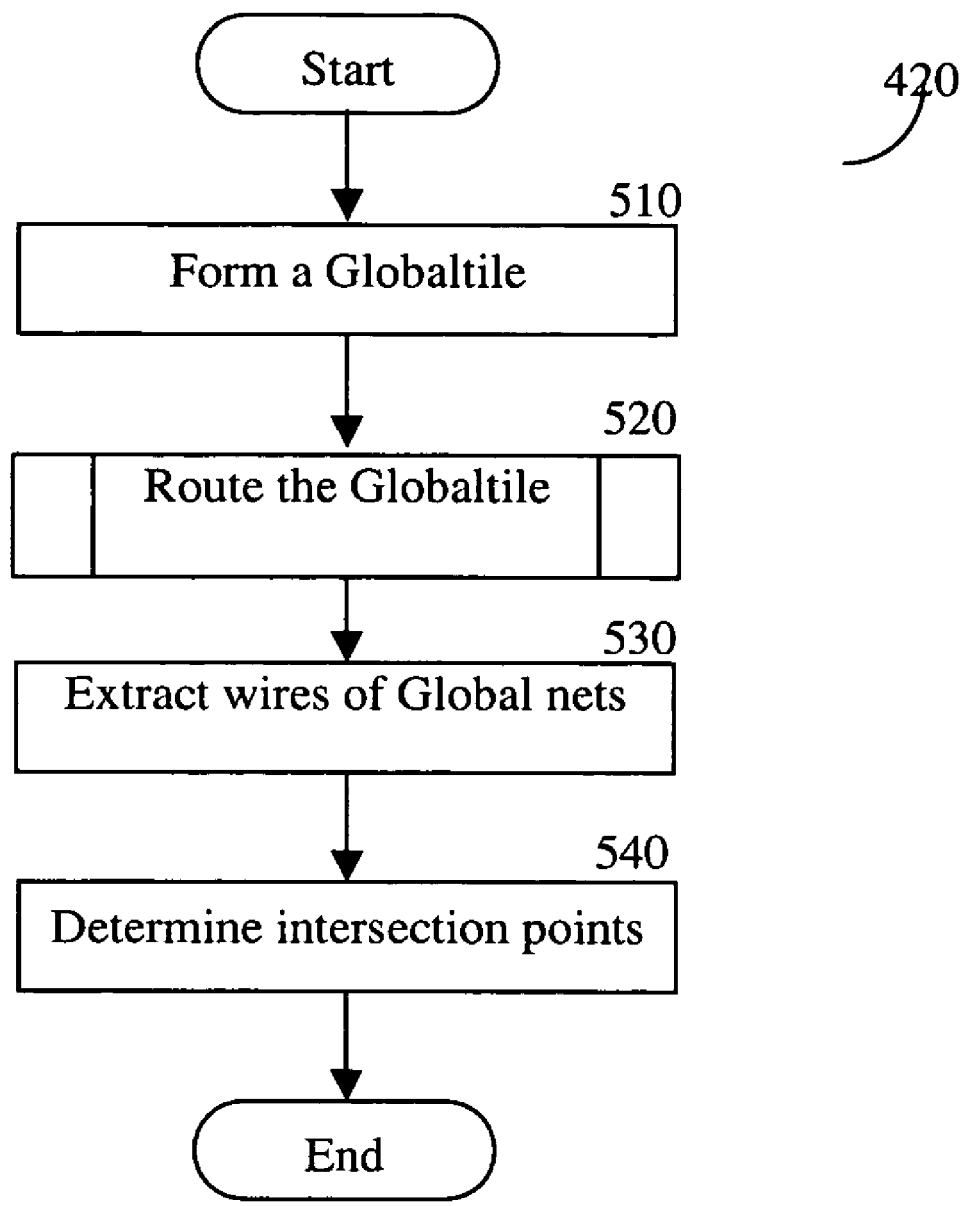
FIG. 5 is a flowchart describing the task of identifying exact positions of exit locations in accordance with one embodiment of the present invention.

FIG. 5 is a non-limiting flowchart 430 describing the process of identifying positions of exit locations in accordance with one embodiment of the present invention. The exact positions of exit locations are identified for all Global nets on the boundaries of all tiles. At 510, an additional routing tile (hereinafter a "Globaltile") having a size of the entire IC is generated. The Globaltile includes all Global nets and building block geometries that are in the vicinity of tile boundaries that Global nets reside in. The Globaltile does not contain any information on the tiles. At 520, the Globaltile is routed as a first tile of the parallel routing and the result is a fine routing of all Global nets included in the Globaltile. Common wisdom of the art shows that the Global nets account for between ten (10) and fifteen (15) percent of the total nets presenting the IC design. Generally, this sparse problem can be easily routed by any fine router. At 530, upon completion of the routing of the Globaltile, each wire of each of the Global nets is extracted, and then, at 540, intersection points where the extracted wires intersect the boundaries of all the tiles are identified. These intersection points are the exit locations of Global nets from the tiles.

It should be noted that the tiling of an IC design is a valuable asset for handling of engineering changes to a completed IC. That is, the tiling approach restricts the work of realizing the change only in tiles that are affected while preserving the rest of the completed design. This is particularly important for very large designs, where a change may affect only a small part of a design, often contained in a single tile.

Figure 6:
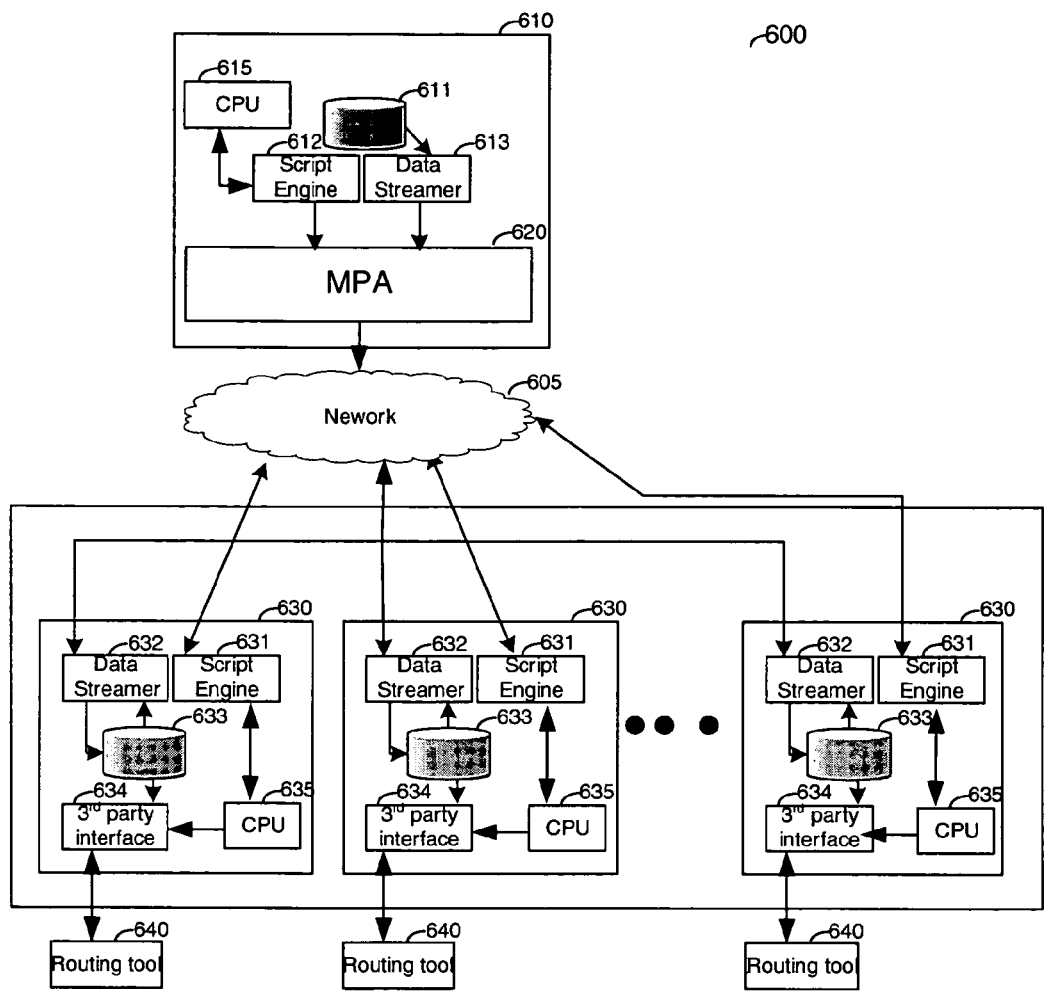
FIG. 6 is a block diagram of an exemplary distributed multi-processing system used to carry out the techniques disclosed in accordance with the present invention.

FIG. 6 shows a diagram of an exemplary distributed multi-processing system 600 that can be utilized to execute the tiling process in accordance with one embodiment of the present invention. System 600 comprises a main computing node 610 and a plurality of distributed remote processing nodes 630. The main computing node 610 includes a main database 611 for holding design information, a script engine 612 for propagating scripts to be executed by remote processing nodes 630, a data streamer. 613 for transferring binary data streams to remote processing nodes 630, and a multi-processing agent (MPA) 620. MPA 620 is the infrastructure that enables the distributed parallel processing. Specifically, MPA 620 manages the distributed processing resources and the transfers of pluralities of data streams to and from remote processing nodes 630. In addition, main computing node 610 preferably includes a central processing unit (CPU) 615 for executing various of the processing tasks.

Each of the remote processing nodes 630 includes a remote script engine 631, a remote data streamer 632 for receiving and transforming data streams, a remote database 633 for maintaining block information, and a third party interface 634. The third party interface 634 interfaces with at least a router 640. A remote processing node 130 preferably includes a CPU 635 having its own operating system and being capable of performing various processing tasks. Remote processing nodes 630 are part of a computer farm where workload management for achieving the maximum utilization of computing resources is performed by MPA 620. The communication between main computing node 610 and a remote processing node 630 is performed over a network 605. The architecture and the operation of system 600 is described in greater detail in U.S. patent application Ser. No. 11/315,892 entitled "System for Performing Parallel Distributed Processing for Physical Layout Generation" assigned to the common assignee and is hereby incorporated by reference for all that it contains.

In accordance with the present invention, the tiling method discussed in greater detail above is executed by main computing node 610. That is, main computing node 610 breaks an IC design, saved in main database 611, into non-overlapping tiles. Each tile is transferred as a data stream to remote processing nodes 630 and saved in remote databases 633. Each of nodes 630 receives the data stream that encapsulates tile information and routes the tile using router 640. In fact, geometries on all layers are copied into the tiles that are sent to routers. The distribution of tasks to remote processing nodes 640 is performed by MPA 620 in a way that ensures optimized performance and load balancing. Once the routing of a tile has completed, only incremental routed data is sent back to main computing node 610 as a data stream. The pieces of incremental routed data received from remote processing nodes 630 are merged and saved in main database 611.

Figure 7A:
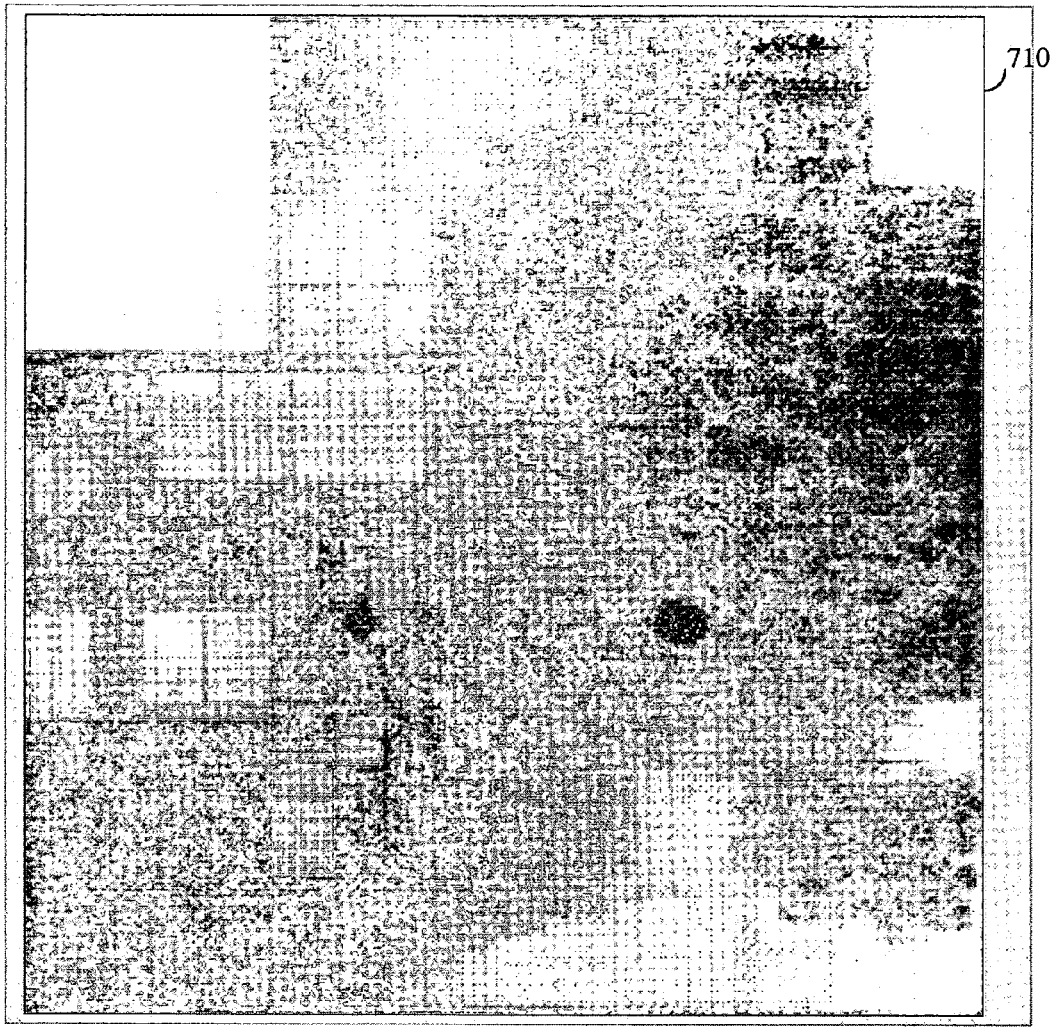
FIGS. 7A and 7B are exemplary layouts before and after the execution of the tiling method of the present invention.
Figure 7B:
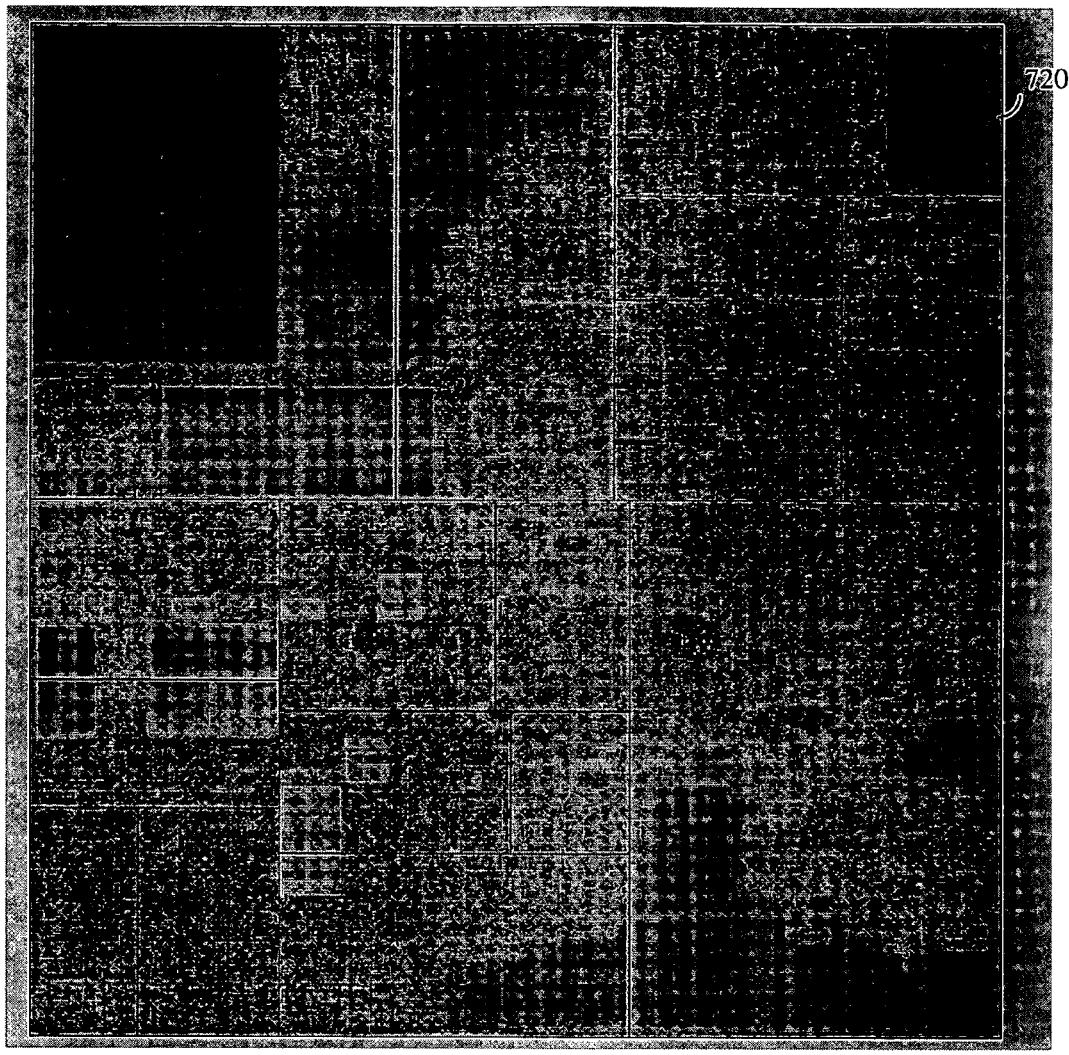

It should be emphasized that the tiling method disclosed herein is a geometric algorithm that divides the physical layout into non-overlapping tiles, the tiles may or may not be of equal size. The number of tiles is preferably on an order of ten (10). FIG. 7A shows an exemplary layout 700 of an IC after placement. Executing the tiling method on layout 700 would result layout 710, shown in FIG. 7B, that includes 17 tiles. As can be shown these tiles are not overlapped and of different tile sizes. In accordance with one embodiment of the present invention, each generated tile can be further used for the purposes of mask analysis and mask generation. This is possible, as a tile represents a small fraction of the complex full IC nevertheless still having the ability to have mask operations performed on it in seclusion from the rest of the tiles. Furthermore, each tile can be used as a data unit that incrementally adjusts routing and mask generation tasks with minimum perturbation to the entire IC.

What is claimed is:

1. A method for tiling an integrated circuit (IC) design, said method comprising:
   computing a routing capacity of each metal lithographic layer of said IC design;
   constructing a set of horizontal and vertical wire segments;
   bi-sectioning said IC design for identifying a set of tiles by;
     receiving a rectangular portion of said IC design, said rectangular portion includes at least one horizontal wire segment and at least one vertical wire segment;
     positioning a cut line perpendicularly to a longer side of said rectangular portion;
     searching for a location such that said cut line cuts a minimum number of wire segments; and
     dividing said rectangular portion in the location with minimum cuts of wire segments, and thereby forming two smaller rectangular portions; and
   partitioning a connectivity of said IC design based on the identified tiles.

2. The method of claim 1, further comprising:
   distributing said tiles to a plurality of distributed routers;
   simultaneously routing said tiles on the plurality of distributed routers; and
   assembling the routed tiles to form a routed IC design.

3. The method of claim 1, wherein said IC design is provided by at least one of: a placement tool, a global router, and a fine router.

4. The method of claim 1, wherein constructing said set of horizontal and vertical wire segments comprises:
   receiving said IC design data from a placement tool;
   for each net in said IC design, constructing an enclosing rectangle, wherein said enclosing rectangle includes all ports of said net; and
   setting two opposite sides of said enclosing rectangle as a wire segment.

5. The method of claim 1, further comprising:
   bi-sectioning rectangular portions formed by bi-sectioning larger rectangular portions until a termination condition is satisfied, thereby forming a final number of nonoverlapping rectangular portions.

6. The method of claim 5, wherein said termination condition is at least one of: a number of said nonoverlapping rectangle portions equals a predefined number, and a number of nets in each nonoverlapping rectangle portion is below a predefined number.

7. The method of claim 6, wherein each of said final number of nonoverlapping rectangular portions is one of said tiles in said set of tiles.

8. The method of claim 7, wherein partitioning said connectivity of said IC comprises:
   sorting nets in said IC design into local nets and global nets;
   identifying exit locations of each of said global nets;
   forming a tile net that includes at least said exit locations inside a tile;
   copying, as a tile net, each local net of a respective tile into the respective tile;
   copying fixed geometries in an area of a tile into said tile.

9. The method of claim 8, further comprising:
   for each of said tiles, generating one track obstacle of a guard band.

10. The method of claim 8, wherein each said local net resides within a respective one of said tiles.

11. The method of claim 8, wherein each said global net resides in a respective plurality of said tiles.

12. The method of claim 8, wherein identifying exit locations further comprises:
   constructing a global tile;
   routing said global tile using a fine router;
   extracting each wire of each of said global nets; and
   identifying intersection points where the extracted wires intersect boundaries of said tiles.

13. A machine-readable medium having embedded thereon, instructions to implement a method for accelerating the generation of a physical layout of an integrated circuit (IC) design, which instructions, when executed by a set of processors, cause said set of processors to perform operations comprising:
   computing a routing capacity of each metal lithographic layer of said IC design;
   constructing a set of horizontal and vertical wire segments;
   bi-sectioning said IC design for identifying a set of tiles by;
      receiving a rectangular portion of said IC design, said rectangular portion includes at least one horizontal wire segment and at least one vertical wire segment;
      positioning a cut line perpendicularly to a longer side of said rectangular portion;
      searching for a location such that said cut line cuts a minimum number of wire segments; and
      dividing said rectangular portion in the location with minimum cuts of wire segments, and thereby forming two smaller rectangular portions; and
   partitioning a connectivity of said IC design based on the identified tiles.

14. The machine-readable medium of claim 13, further comprising:
   distributing said tiles to a plurality of distributed routers;
   simultaneously routing said tiles on a set of distributed routers; and
   assembling the routed tiles to form a routed IC design.

15. The machine-readable medium of claim 14, wherein said IC design is provided by at least one of: a placement tool, a global router, and a fine router.

16. The machine-readable medium of claim 14, wherein constructing said set of horizontal and vertical wire segments comprises:
   receiving said IC design data from a placement tool;
   for each net in said IC design, constructing an enclosing rectangle, wherein said enclosing rectangle includes all ports of said net; and
   setting two opposite sides of said enclosing rectangle as a wire segment.

17. The machine-readable medium of claim 13, further comprising:
   bi-sectioning each of said smaller rectangular portion until a termination condition is satisfied, thereby forming a final number of nonoverlapping rectangular portions.

18. The machine-readable medium of claim 17, wherein said termination condition is at least one of: a number of said final rectangle portions equals a predefined number, and a number of nets in each final rectangle portion is below a predefined number.

19. The machine-readable medium of claim 17, wherein each of the rectangular portions in said final number of rectangle portions is a said tile.

20. The machine-readable medium of claim 18, wherein partitioning said connectivity of said IC comprising:
   sorting nets in said IC design into local nets and global nets;
   identifying exit locations of each of said global nets;
   forming a tile net that includes at least said exit locations inside a tile;
   copying, as a tile net, each local net of a respective tile into the respective tile;
   copying fixed geometries in an area of a tile into said tile.

21. The machine-readable medium of claim 20, further comprising:
   for each of said tiles, generating one track obstacle of a guard band.

22. The machine-readable medium of claim 20, wherein each said local net resides within a respective one of said tiles.

23. The machine-readable medium of claim 20, wherein each said global net resides in a respective plurality of said tiles.

24. The machine-readable medium of claim 20, wherein identifying exit locations further comprises:
   constructing a global tile;
   routing said global tile using a fine router;
   extracting each wire of each of said global nets; and
   identifying intersection points where the extracted wires intersect boundaries of said tiles.

* * * * *